United States Patent
Huster et al.

(10) Patent No.: US 6,395,606 B1
(45) Date of Patent: May 28, 2002

(54) MOSFET WITH METAL IN GATE FOR REDUCED GATE RESISTANCE

(75) Inventors: Carl R. Huster, Sunnyvale; Ognjen Milic-Strkalj, Burlingame; Emi Ishida, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/357,918

(22) Filed: Jul. 21, 1999

(51) Int. Cl.[7] ............................................. H01L 21/336
(52) U.S. Cl. ........................ 438/289; 438/305; 438/595
(58) Field of Search .................................. 438/514, 519, 438/373, 450, 473, 506, 527, 305, 592, 291, 199, 259, 202, 205

(56) References Cited

U.S. PATENT DOCUMENTS

| | | | | |
|---|---|---|---|---|
| 4,212,684 A | * | 7/1980 | Brower | 148/1.5 |
| 5,600,168 A | * | 2/1997 | Lee | 257/336 |
| 5,605,855 A | * | 2/1997 | Chang et al. | 437/45 |
| 5,627,091 A | * | 5/1997 | Hong | 438/276 |
| 5,824,575 A | * | 10/1998 | Fujimoto et al. | 438/174 |
| 5,879,998 A | * | 3/1999 | Kirivokapic | 438/45 |
| 5,891,787 A | * | 4/1999 | Gardner et al. | 438/424 |
| 5,911,107 A | * | 6/1999 | Tanaka | 438/276 |
| 6,008,093 A | * | 12/1999 | Aoki et al. | 438/276 |
| 6,083,795 A | * | 7/2000 | Liang et al. | 438/289 |

* cited by examiner

*Primary Examiner*—Olik Chaudhuri
*Assistant Examiner*—Shrinivas H Rao

(57) ABSTRACT

A MOS semiconductor device is formed with reduced parasitic junction capacitance and reduced gate resistance. Embodiments include forming oxide sidewall spacers on side surfaces of openings in a nitride layer exposing the substrate, and performing a channel implant. A thin gate oxide layer is then thermally grown on the exposed portion of the substrate, and a relatively thin polysilicon layer is deposited on the gate oxide layer and the spacers. A metal layer, such as tungsten, is then deposited filling the opening, and planarized, as by chemical-mechanical polishing, using the nitride layer as a polish stop. Source/drain regions are thereafter formed by ion implantation, and the source/drain regions are silicided. The sidewall spacers and the nitride layer block the channel implant from the source/drain areas, thereby reducing parasitic junction capacitance, and the metal layer extending from above the gate oxide layer to the top of the gate reduces gate resistance, thereby increasing the switching speed of the finished device.

11 Claims, 4 Drawing Sheets

MOSFET WITH METAL IN GATE FOR REDUCED GATE RESISTANCE

FIELD OF THE INVENTION

The present invention relates to a method of manufacturing a metal oxide semiconductor device on a semiconductor substrate. The present invention has particular applicability in manufacturing metal oxide semiconductor devices with low gate resistance and low junction capacitance.

BACKGROUND ART

Metal oxide semiconductor (MOS) devices typically comprise a pair of ion implanted source/drain regions in a semiconductor substrate, an ion implanted channel region separating the source/drain regions, and a thin gate oxide and a conductive gate, typically polysilicon, formed above the channel region. Conventional approaches to forming MOS devices typically comprise initially blanket doping the substrate with the intended channel implant before gate oxidation, forming the gate oxide and the gate, then counter-doping the source/drain regions and annealing to electrically activate the implants. Thereafter, refractory metal silicide contacts are formed on the source/drain regions and the top of the gate to reduce the device's gate and source/drain resistance.

Current demands for miniaturization and increased circuit density have led to a dramatic reduction in feature sizes. However, when feature sizes are scaled to below about 1 $\mu$m, the above-described conventional technique results in devices exhibiting undesirably increased junction capacitance due to the presence of the channel dopant in the source/drain regions. Furthermore, demands for increased switching speeds require lower gate resistance, which is difficult to achieve with conventional silicide-capped polysilicon gates.

There exists a need for a method of manufacturing a semiconductor device with channel doping localized under the gate, thereby reducing junction capacitance, and with decreased gate resistance, thereby increasing switching speeds.

SUMMARY OF THE INVENTION

An advantage of the present invention is a method of manufacturing a semiconductor device having localized channel doping under the gate while also having lower gate resistance than devices manufactured using conventional techniques.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of manufacturing a semiconductor device, which method comprises forming a silicon nitride layer on a main surface of a semiconductor substrate; forming an opening in the silicon nitride layer to expose a portion of the main surface, the opening corresponding to a dimension of a transistor gate and having substantially vertical side surfaces; forming sidewall spacers on the side surfaces of the opening and extending onto the exposed portion of the main surface; ion implanting impurities into the substrate through the opening to form a threshold implant using the silicon nitride layer and the sidewall spacers as a mask; forming a gate oxide layer on a part of the exposed portion of the main surface not covered by the sidewall spacers; forming a doped polysilicon layer on the gate oxide and the sidewall spacers; and forming a metal layer to fill the opening.

Another aspect of the present invention is a semiconductor device comprising a gate oxide layer on a main surface of a semiconductor substrate, and a gate having outwardly sloping side surfaces and a top surface, the gate comprising a doped polysilicon layer on the gate oxide layer and extending along the side surfaces, and a metal layer on the polysilicon layer and extending to the top surface.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1A:
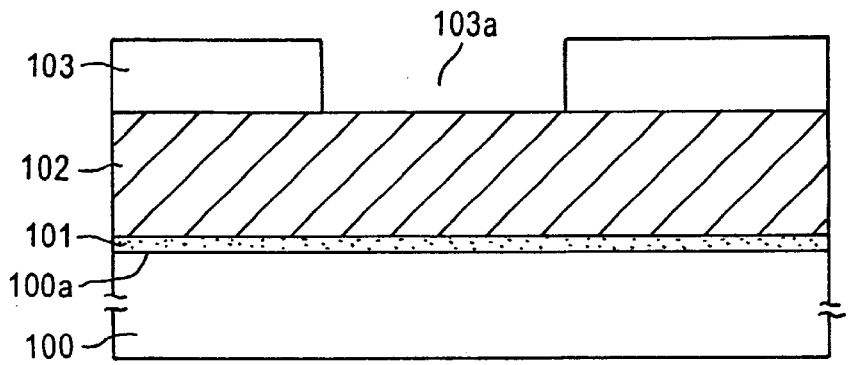
FIGS. 1A–1J schematically illustrate sequential phases of a method in accordance with an embodiment of the present invention.

Conventional methodologies for manufacturing semiconductor devices undesirably result in diffusion of channel region dopants under source/drain junctions, thereby increasing parasitic junction capacitance. Such conventional methodologies also yield devices exhibiting undesirably high gate resistance and inadequate switching speeds. The present invention addresses and solves these problems stemming from conventional manufacturing processes.

According to the methodology of the present invention, the channel dopant is confined under the gate and the gate resistance is reduced. Embodiments of the present invention include forming a silicon nitride layer on a main surface of a semiconductor substrate. As used throughout the present disclosure and claims, the term "substrate" denotes a semiconductor substrate or an epitaxial layer formed on the semiconductor substrate. A through-opening is formed in the nitride layer corresponding to a dimension of a gate to be formed on the substrate, as by masking and etching. Spacers, such as silicon dioxide spacers, are formed on sidewalls of the opening, and a threshold implant (i.e., a channel implant) is formed in the substrate, as by ion implantation of impurities. A thin gate oxide layer is then thermally grown on the exposed portion of the substrate, and a relatively thin polysilicon layer is deposited, as by chemical vapor deposition (CVD) on the gate oxide layer and the spacers. A metal layer, such as tungsten, is then formed to fill the opening, and planarized, as by chemical-mechanical polishing (CMP), using the nitride layer as a polish stop.

Thereafter, the nitride layer is removed, and conventional lightly-to-moderately doped implants are formed in the source/drain areas adjacent to the gate, as by ion implantation. Spacers, such as silicon dioxide spacers, are then formed on the gate sidewalls, and moderate-to-heavy source/drain implants are formed in the source/drain areas in a conventional manner. The substrate is then heated, as by rapid thermal annealing (RTA), to electrically activate the implants, after which the threshold implant and the lightly-to-moderately doped source/drain implants overlap slightly. A conventional silicidation procedure is then carried out, resulting in silicided contacts in the source/drain regions but not over the gate, since the top of the gate is largely tungsten, not silicon.

With the present methodology, because the threshold implant is blocked from the source/drain regions, channel region dopants do not contribute to the creation of parasitic junction capacitance. Furthermore, gate resistance is lowered and switching speed of the finished device increased vis-a-vis gates made using conventional techniques, due to the presence of metal near the bottom of the gate. The gate produced according to the present invention has low resistance because the metal layer, which is located near the gate oxide layer and extends to the top of the gate, has a lower resistance than conventional polysilicon gates with silicided contacts.

An embodiment of the present invention is illustrated in FIGS. 1A–1J, wherein sequential phases in forming a semiconductor device in accordance with the present invention are depicted. Referring to FIG. 1A. substrate 100 is prepared having a substantially planar main surface 100a, typically a semiconductor substrate comprising doped monocrystalline silicon or an epitaxial layer formed on a semiconductor substrate in accordance with conventional practices.

After formation of field isolation regions (not shown), gate structures are formed by first forming a pad oxide 101 on main surface 100a, as by thermal oxidation, to a thickness of about 60 Å. A silicon nitride layer 102 is formed on pad oxide layer 101, as by CVD, to a thickness of about 500 Å to about 2000 Å; e.g., about 1000 Å. Next, a photoresist mask 103 is formed on nitride layer 102, mask 103 having openings 103a corresponding to a dimension of the subsequently formed gates.

Figure 1B:
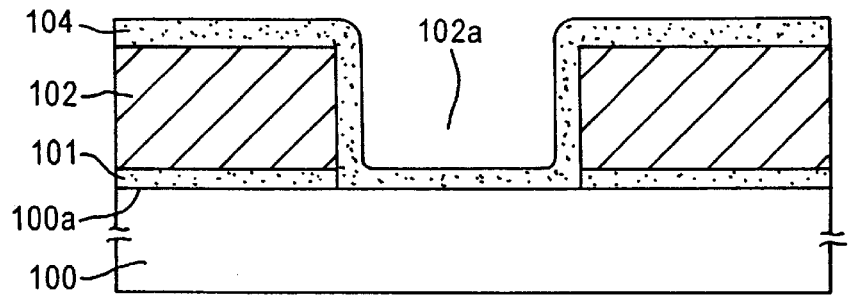
Figure 1C:
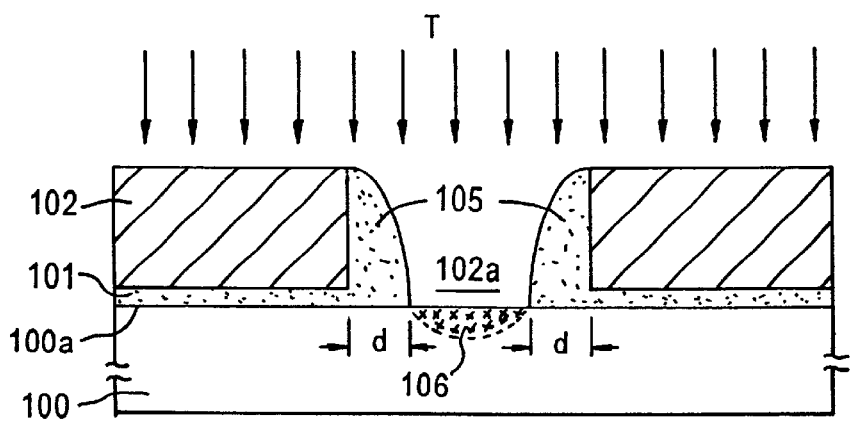

Referring to FIG. 1B, nitride layer 102 and pad oxide 101 are etched, as by wet etching, to form openings 102a in nitride layer 102 exposing a portion of main surface 100a. A spacer formation layer 104 is then formed in openings 102a and extending onto nitride layer 102, such as silicon dioxide by low pressure chemical vapor deposition (LPCVD). As shown in FIG. 1C, spacer formation layer 104 is then anisotropically etched to form sidewall spacers 105 on the side surfaces of openings 102a that extend onto the exposed portion of main surface 100a.

Next, impurities T are implanted, as by ion implantation, into substrate 100 through opening 102a to form a conventional threshold implant 106 (also called a "channel implant") using nitride layer 102 and sidewall spacers 105 as a mask. Typically, threshold implant 106 comprises arsenic, phosphorus or boron implanted at a dosage of about $1 \times 10^{13}$ atoms cm$^{-2}$ at an energy of about 5 keV.

Sidewall spacers 105 serve to locate threshold implant 106 such that subsequently formed lightly-to-moderately doped source/drain implants slightly overlap threshold implant 106 after both implants are electrically activated. For example, spacer formation layer 104 is deposited to a thickness of about 100 Å, and after etching, spacers 105 extend onto main surface 100a a distance "d" slightly less than about 100 Å.

Figure 1D:
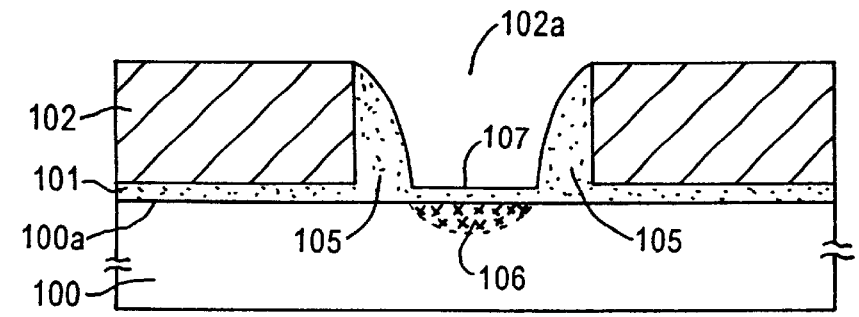
Figure 1E:
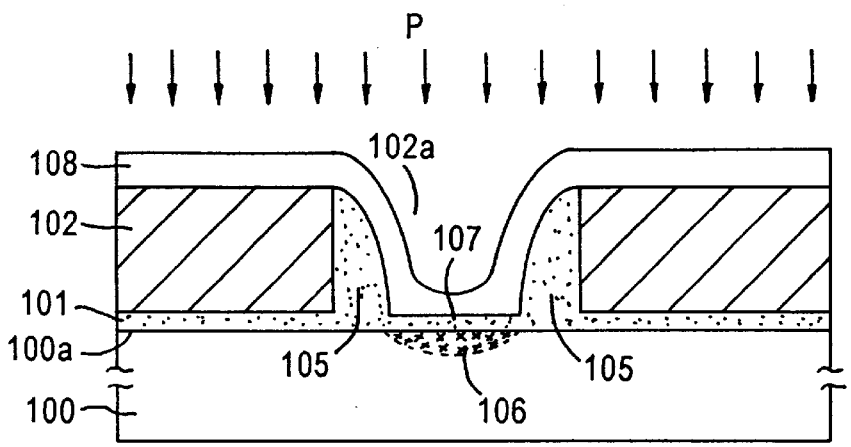

Referring now to FIG. 1D, a gate oxide layer 107 is thermally grown to a thickness of about 20 Å on the exposed portion of main surface 100a not covered by sidewall spacers 105 or nitride layer 102. Next, as shown in FIG. 1E, a blanket polysilicon layer 108 is deposited, as by LPCVD, on gate oxide layer 107, sidewall spacers 105 and nitride layer 102. The thickness of polysilicon layer 108 is minimal; e.g., about 150 Å to about 200 Å, but sufficient to ensure that the subsequently formed metal layer does not affect the electrical characteristics of polysilicon layer 108. Polysilicon layer 108 is then implanted with impurities P, as by ion implantation of arsenic or boron at an energy of about 2 keV to about 5 keV and at a dosage of about $4 \times 10^{15}$ atoms cm$^{-2}$. In another embodiment of the present invention, polysilicon layer 108 is deposited as a doped polysilicon layer to about 150 Å to about 200 Å, instead of depositing an undoped layer and performing a separate implantation step.

Figure 1F:
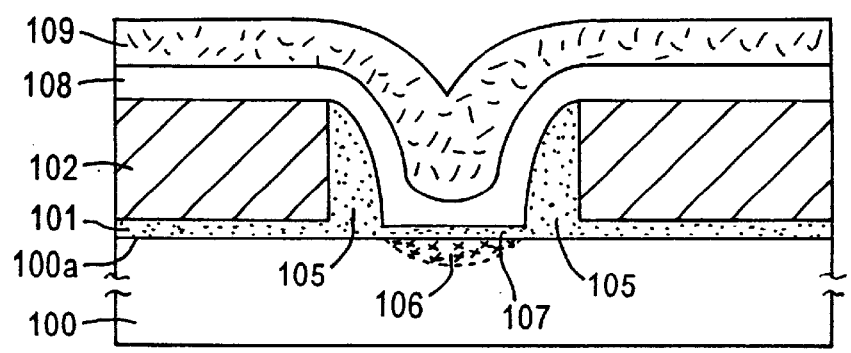
Figure 1G:
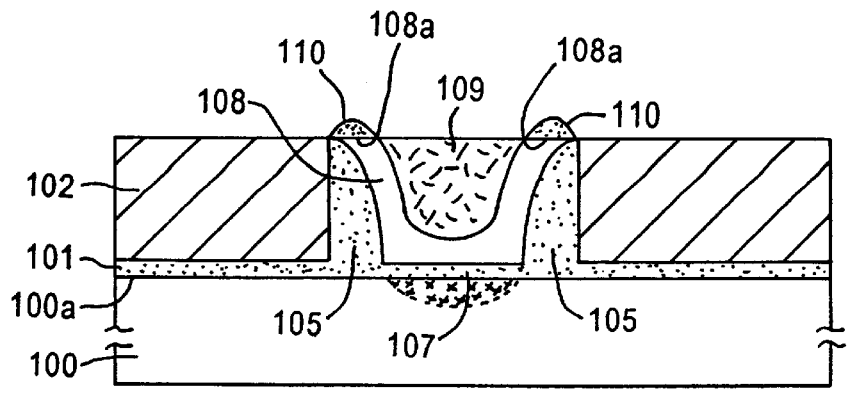

As shown in FIG. 1F, a metal layer 109 is then formed on polysilicon layer 108 to fill opening 102a. such as a layer of tungsten by LPCVD or by sputtering. Metal layer 109 is then planarized, as by CMP, using nitride layer 102 as a polish stop, to expose nitride layer 102 and portions 108a of polysilicon layer 108 (see FIG. 1G). A protective oxide layer 110 is then thermally grown on exposed portions 108a of polysilicon layer 108, and nitride layer 102 is removed, as by etching with phosphoric acid, to leave the completed gate G having outer sidewalls 105a. Protective oxide layer 110, which grows only on exposed portions 108a, prevents erosion of polysilicon layer 108 during etching of nitride layer 102.

Figure 1H:
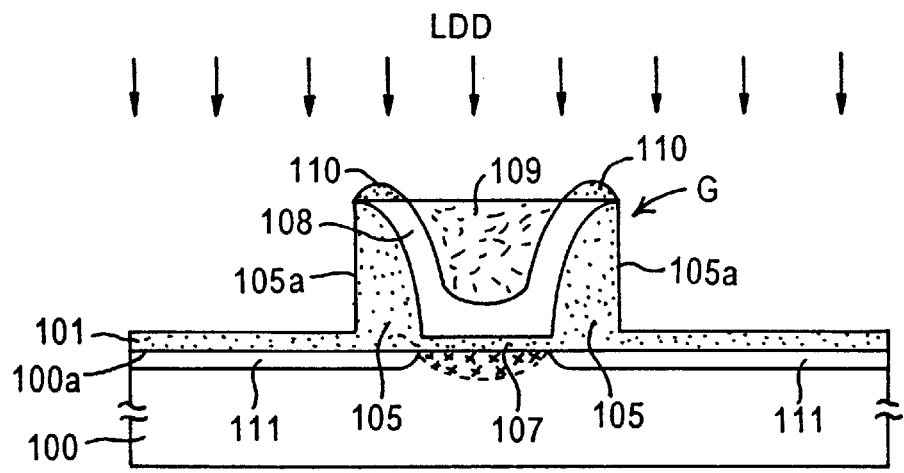
Figure 1I:
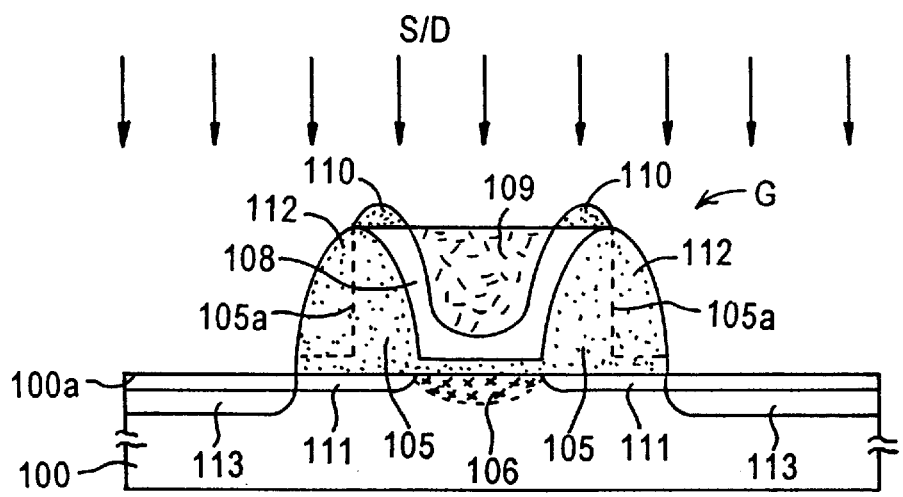
Figure 1J:
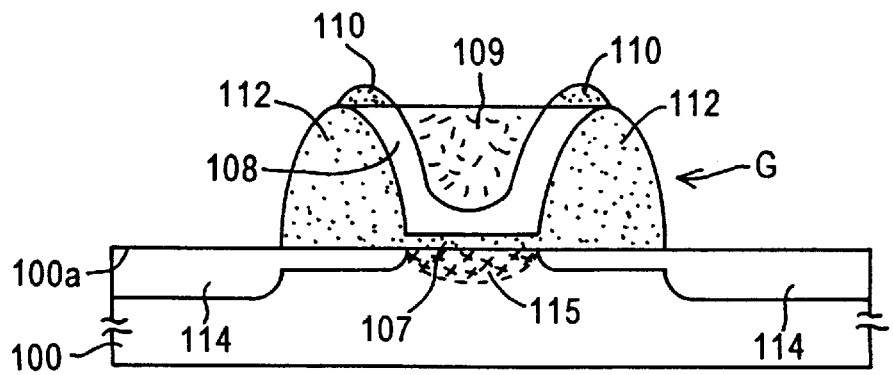

Referring now to FIG. 1H, a conventional lightly-to-moderately doped source/drain implant LDD is thereafter performed, as by ion implantation of impurities such as arsenic or boron at an energy of about 5 keV and a dosage of about $4 \times 10^{12}$ atoms cm$^{-2}$, to form lightly-to-moderately doped source/drain implants 111. Spacers 112, as shown in FIG. 1I, are then formed on gate sidewalls 105a, such as silicon dioxide spacers by depositing a silicon dioxide layer and anisotropically etching in a conventional manner. A conventional moderately-to-heavily doped source/drain implant S/D is then performed, as by ion-implanting impurities such as arsenic or boron at an energy of about 10 keV and a dosage of about $1 \times 10^{15}$ atoms cm$^{-2}$, to form moderately-to-heavily doped source/drain implants 113. Threshold implant 106 and source/drain implants 111, 113 are thereafter electrically activated, as by heating by conventional RTA, to form source/drain regions 114 which slightly overlap channel region 115 (see FIG. 1J).

Subsequent process steps include forming low-resistance contacts on source/drain regions 114 by deposition of a refractory metal such as cobalt or titanium, heating to form a metal suicide at the top of source/drain regions 114, and etching to remove the unreacted refractory metal. The silicidation reaction will not take place on the top of gate G, since it consists of metal layer 109 and protective oxide spacers 110. However, silicide is not needed to form a contact to gate G, since metal layer 109 (e.g., tungsten) has a lower electrical resistance than silicide.

Figure 2:
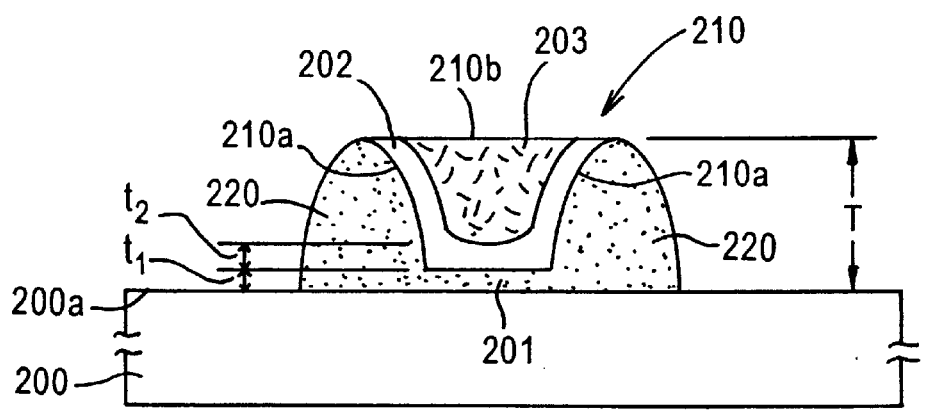
FIG. 2 is a cross-sectional view of a semiconductor device according to an embodiment of the present invention.

A semiconductor device produced according to an embodiment of the invention is illustrated in FIG. 2, and comprises a gate oxide layer 201 having a thickness $t_1$ of about 20 Å on a main surface 200a of a semiconductor substrate 200. A gate 210 having outwardly sloping side surfaces 210a and a top surface 210b comprises a doped polysilicon layer 202 on gate oxide layer 201 extending along side surfaces 210a, and a metal layer 203, such as a tungsten layer, on polysilicon layer 202 and extending to top surface 210b. Insulating sidewall spacers 220 on side surfaces 210a extend onto main surface 200a. Polysilicon layer 202 has a thickness $t_2$ of about 150 Å to about 200 Å; and gate oxide layer 201 and gate 210 have a combined thickness T of about 500 Å to about 2000 Å; e.g., about 1000 Å.

The inventive methodology uses nitride layer 102 and sidewall spacers 105 to block the threshold implant from areas in substrate 100 other than channel areas, thereby preventing increased junction capacitance due to the presence of the unneeded channel implant in source/drain regions 114. Furthermore, since metal layer 109 is in close proximity gate oxide layer 107 (metal layer 109 is separated from gate oxide layer 107 only by the thickness of polysilicon layer 108) and extends to the top of gate G, gate G exhibits lower resistance than gates manufactured by conventional techniques. Thus, the performance and reliability of the finished semiconductor devices is improved.

The present invention is applicable to the manufacture of various types of semiconductor devices, particularly high density semiconductor devices having a design rule of about 0.18 $\mu$ and under; e.g., 0.15 $\mu$m and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a silicon nitride layer on a main surface of a semiconductor substrate;

forming an opening in the silicon nitride layer to expose a portion of the main surface, the opening corresponding to a dimension of a transistor gate and having substantially vertical side surfaces;

forming sidewall spacers on the side surfaces of the opening extending onto the exposed portion of the main surface;

ion implanting impurities into the substrate through the opening to form a threshold implant, using the silicon nitride layer and the sidewall spacers as a mask;

forming a gate oxide layer on a part of the exposed portion of the main surface not covered by the sidewall spacers;

forming a doped polysilicon layer on the gate oxide and the sidewall spacers; and forming a metal layer to fill the opening.

2. The method according to claim 1, comprising:

depositing a spacer formation layer of silicon dioxide in the opening; and anisotropically etching the spacer formation layer to form the sidewall spacers.

3. The method according to claim 2, comprising depositing the spacer formation layer to a thickness of about 100 Å.

4. The method according to claim 1, comprising thermally growing the gate oxide layer to a thickness of about 20 Å.

5. The method according to claim 1, comprising:

depositing a polysilicon layer to a thickness of about 150 Å to about 200 Å on the gate oxide and the sidewall spacers; and ion implanting impurities to form the doped polysilicon layer.

6. The method according to claim 5, comprising implanting arsenic or boron at an energy about 2 keV to about 5 keV and at a dosage of about $4\times10^{15}$ atoms $cm^{-2}$.

7. The method according to claim 1, comprising depositing tungsten to form the metal layer.

8. The method according to claim 1, comprising:

removing the silicon nitride layer;

ion implanting impurities into the substrate to form a lightly or moderately doped source/drain implant; and heating to electrically activate the threshold and source/drain implants;

wherein the sidewall spacers are formed such that the threshold and source/drain implants overlap after the heating step.

9. The method according to claim 8, comprising forming the sidewall spacers to extend onto the exposed portion of the main surface about 100 Å or less.

10. The method according to claim 8, comprising, prior to removing the silicon nitride layer:

forming the doped polysilicon layer to cover the silicon nitride layer;

forming the metal layer to cover the doped polysilicon layer;

planarizing the metal layer to expose the silicon nitride layer and portions of the doped polysilicon layer; and thermally growing a protective silicon dioxide layer on the exposed portions of the polysilicon layer.

11. The method according to claim 10, comprising etching to remove the silicon nitride layer.

* * * * *

UNITED STATES PATENT AND TRADEMARK OFFICE
CERTIFICATE OF CORRECTION

PATENT NO.    : 6,395,606 B1
DATED         : May 28, 2002
INVENTOR(S)   : Carl R. Huster et al.

It is certified that error appears in the above-identified patent and that said Letters Patent is hereby corrected as shown below:

Column 5,
Between lines 47 and 48, insert: -- thermally growing a pad oxide layer to a thickness of about 60Å on a main surface of a semiconductor substrate; --;
Lines 48-49, change from "forming a silicon nitride layer on a main surface of a semiconductor substrate;" to -- forming a silicon nitride layer having a thickness of about 500Å to about 2000Å on the pad oxide layer; --;

Column 6,
Lines 6-7, change from "forming a doped polysilicon layer on the gate oxide and the sidewall spacer; and" to -- forming a doped polysilicon layer having a thickness of about 150Å to about 200Å on the gate oxide and the sidewall spacers; and --.

Signed and Sealed this

Twenty-sixth Day of November, 2002

*Attest:*

JAMES E. ROGAN
*Attesting Officer*            *Director of the United States Patent and Trademark Office*